United States Patent
Konecny et al.

(10) Patent No.: US 9,342,084 B1
(45) Date of Patent: May 17, 2016

(54) BIAS CIRCUIT FOR GENERATING BIAS OUTPUTS

(71) Applicant: Silicon Laboratories Inc., Austin, TX (US)

(72) Inventors: Pavel Konecny, Asker (NO); Dag Pettersen, Oslo (NO)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/627,159

(22) Filed: Feb. 20, 2015

(51) Int. Cl.
  *G05F 1/10* (2006.01)
  *G05F 1/46* (2006.01)
  *H03K 5/24* (2006.01)
  *G05F 3/26* (2006.01)

(52) U.S. Cl.
  CPC ............... *G05F 1/463* (2013.01); *G05F 3/262* (2013.01); *H03K 5/24* (2013.01)

(58) Field of Classification Search
  CPC ......... G05F 1/463; G05F 3/262; H03K 17/22; H03K 17/223
  See application file for complete search history.

(56) References Cited

U.S. PATENT DOCUMENTS

| | | | |
|---|---|---|---|
| 4,375,595 A | 3/1983 | Ulmer et al. | |
| 4,896,094 A | 1/1990 | Greaves et al. | |
| 5,059,820 A | 10/1991 | Westwick | |
| 7,570,091 B2 * | 8/2009 | Sugio | H03K 17/22 327/142 |
| 8,629,713 B2 * | 1/2014 | Pietri | H03K 17/22 327/143 |

OTHER PUBLICATIONS wikipedia.org, "Bandgap Voltage Reference," Jan. 17, 2015, 5 pages.
U.S. Appl. No. 14/549,910, filed Nov. 21, 2014, entitled "Image Rejection Calibration With a Passive Network," by John M. Khoury, et al.

* cited by examiner

*Primary Examiner* — Jeffrey Zweizig
(74) *Attorney, Agent, or Firm* — Trop, Pruner & Hu, P.C.

(57) ABSTRACT

In one aspect, an apparatus includes a ready circuit to output a ready indicator when a supply voltage provided to the ready circuit and a voltage regulator is sufficient to operate the voltage regulator. In turn, the voltage regulator is to receive the supply voltage and output a regulated voltage, receive a first current from the ready circuit and control the regulated voltage based on the first current when the ready indicator is inactive. The apparatus further includes a bias circuit to receive the regulated voltage and generate one or more bias currents, which may be provided to an output circuit to output one or more bias outputs to one or more client circuits therefrom.

23 Claims, 11 Drawing Sheets

BIAS CIRCUIT FOR GENERATING BIAS OUTPUTS

BACKGROUND

Many integrated circuits (ICs) include a multitude of internal circuits to perform a variety of different functionality. To enable certain circuits to properly operate, components of the circuits such as transistors and other electrical elements may require a bias current and/or voltage. Often, an IC includes an internal bias generator to generate such bias signals. However, these circuits can consume an undesired amount of power to provide the bias signals at appropriate levels. In addition, these circuits can be difficult to control, particularly as the operating requirements of the underlying IC vary.

SUMMARY OF THE INVENTION

In one aspect, an apparatus includes a ready circuit to output a ready indicator when a supply voltage provided to the ready circuit and a voltage regulator is sufficient to operate the voltage regulator. In turn, the voltage regulator is to receive the supply voltage and output a regulated voltage, receive a first current from the ready circuit and control the regulated voltage based on the first current when the ready indicator is inactive. The apparatus further includes a bias circuit to receive the regulated voltage, which includes a first circuit to generate a first bandgap bias current and a second circuit to generate a second bias current. An output circuit is to receive a selected one of the first bandgap bias current and the second bias current and output one or more bias outputs to one or more client circuits based on the selected one of the first bandgap bias current and the second bias current.

In an example, the voltage regulator is to control the regulated voltage based on one of the one or more bias outputs from the output circuit when the ready indicator is active. The ready circuit may include a first plurality of complementary metal oxide semiconductor (CMOS) current mirrors, one of which is to provide the first current to the voltage regulator. The output circuit may include a second plurality of CMOS current mirrors to receive the selected one of the first bandgap bias current and the second bias current and to generate the one or more bias outputs therefrom. The first circuit may include a bandgap core circuit and the second circuit includes a constant-transconductance circuit.

In an example, the voltage regulator includes a first pre-amplifier to operate at a first power consumption level and a second pre-amplifier to operate at a second power consumption level, where the first pre-amplifier is controlled to be powered on during on portions of a duty cycle mode, and the second pre-amplifier is controlled to be powered on during the on portions and off portions of the duty cycle mode, the second power consumption level less than the first power consumption level. The voltage regulator may further include: a first switch to provide a first reference voltage to the first pre-amplifier when the ready indicator is inactive and to provide a second reference voltage to the first pre-amplifier when the ready indicator is active; and a second switch to provide an output of the first pre-amplifier to an output device of the voltage regulator when the ready indicator is active and to provide the first reference voltage to the output device when the ready indicator is inactive.

In an example, the apparatus further includes a controller to enable the constant-transconductance circuit to recharge a charge storage device of the output circuit at a first interval, and to enable the constant-transconductance circuit and the bandgap core circuit to perform a calibration of the second bias current to the first bandgap bias current at a second interval, the second interval greater than the first interval.

In another aspect, a method includes: after a first predetermined interval, exiting a sleep state of a bias circuit and causing a charge storage device of an output circuit of the bias circuit to be refreshed using a first bias current generated by a constant-transconductance circuit of the bias circuit; after refreshing the charge storage device, causing the bias circuit to enter the sleep state; after a second predetermined interval, exiting the sleep state of the bias circuit and causing the first bias current to be compared to a second bias current generated by a bandgap bias circuit of the bias circuit, and updating a calibration value based on the comparison, where the calibration value is used to calibrate the first bias current to the second bias current; and after updating the calibration value, causing the bias circuit to enter the sleep state.

In an example, exiting the sleep state after the first predetermined interval further includes enabling a secondary pre-amplifier of a regulator circuit of the bias circuit. Exiting the sleep state after the first predetermined interval may further include enabling the constant-transconductance circuit while maintaining the bandgap bias circuit disabled.

In an example, the method further includes enabling a primary pre-amplifier of the regulator circuit to cause the regulator circuit to output the regulated voltage. In an active mode of an integrated circuit including the bias circuit, the method may further include exiting the sleep state and enabling the constant-transconductance circuit, the bandgap bias circuit, and a first pre-amplifier of the regulator circuit. Updating the calibration value includes storing, in a storage, a control setting for a resistance element coupled to a current mirror of the constant-transconductance circuit to control a resistance of the resistance element.

In an example, the method further includes determining a temperature based on the calibration value and updating one or more device characteristics of the integrated circuit including the bias circuit based thereon. Note that a state machine may be used to control the bias circuit, in an example.

Another aspect is directed to an integrated circuit including: a plurality of client circuits, at least some of the plurality of client circuits to receive a bias signal; and a bias circuit to generate a plurality of bias signals and provide at least some of the plurality of bias signals to one or more of the plurality of client circuits. In one example, the bias circuit includes: a ready circuit to indicate when a supply voltage is sufficient to operate the bias circuit; a voltage regulator coupled to the ready circuit to output a regulated voltage; a first bias circuit to generate a first bias current; a second bias circuit to generate a second bias current; and an output circuit to receive at least one of the first bias current and the second bias current and generate the plurality of bias signals therefrom, where the first bias circuit, the second bias circuit and the output circuit are to operate using the regulated voltage.

The voltage regulator, the first bias circuit and the second bias circuit are to operate in a duty cycle mode. In an example, the ready circuit includes a comparator having: a first input terminal to receive a first voltage based on a proportional to absolute temperature (PTAT) current, the PTAT current generated via a CMOS current generator circuit having a plurality of CMOS current mirrors; a second input terminal to receive a reference voltage corresponding to a predetermined portion of the supply voltage; and a comparison circuit to compare a first voltage based on the PTAT current to the reference voltage and to output a comparison value; and a delay circuit to receive the comparison value and output a ready signal to the voltage regulator following a threshold period after the first voltage exceeds the reference voltage.

The integrated circuit may further include a calibration circuit to compare the first bias current to the second bias current and to generate a calibration value therefrom, the calibration value to control a controllable resistance coupled to a current mirror of the second bias circuit.

In an example, the voltage regulator includes: a first pre-amplifier to operate at a first power consumption level; and a second pre-amplifier to operate at a second power consumption level, the second power consumption level less than the first power consumption level.

BRIEF DESCRIPTION OF THE DRAWINGS

FIGS. 2 and 2-1 are a block diagram including further details of a bias circuit in accordance with an embodiment.

FIGS. 5 and 5-1 are a schematic diagram of further details of additional circuits within a bias circuit in accordance with an embodiment.

DETAILED DESCRIPTION

Figure 1:
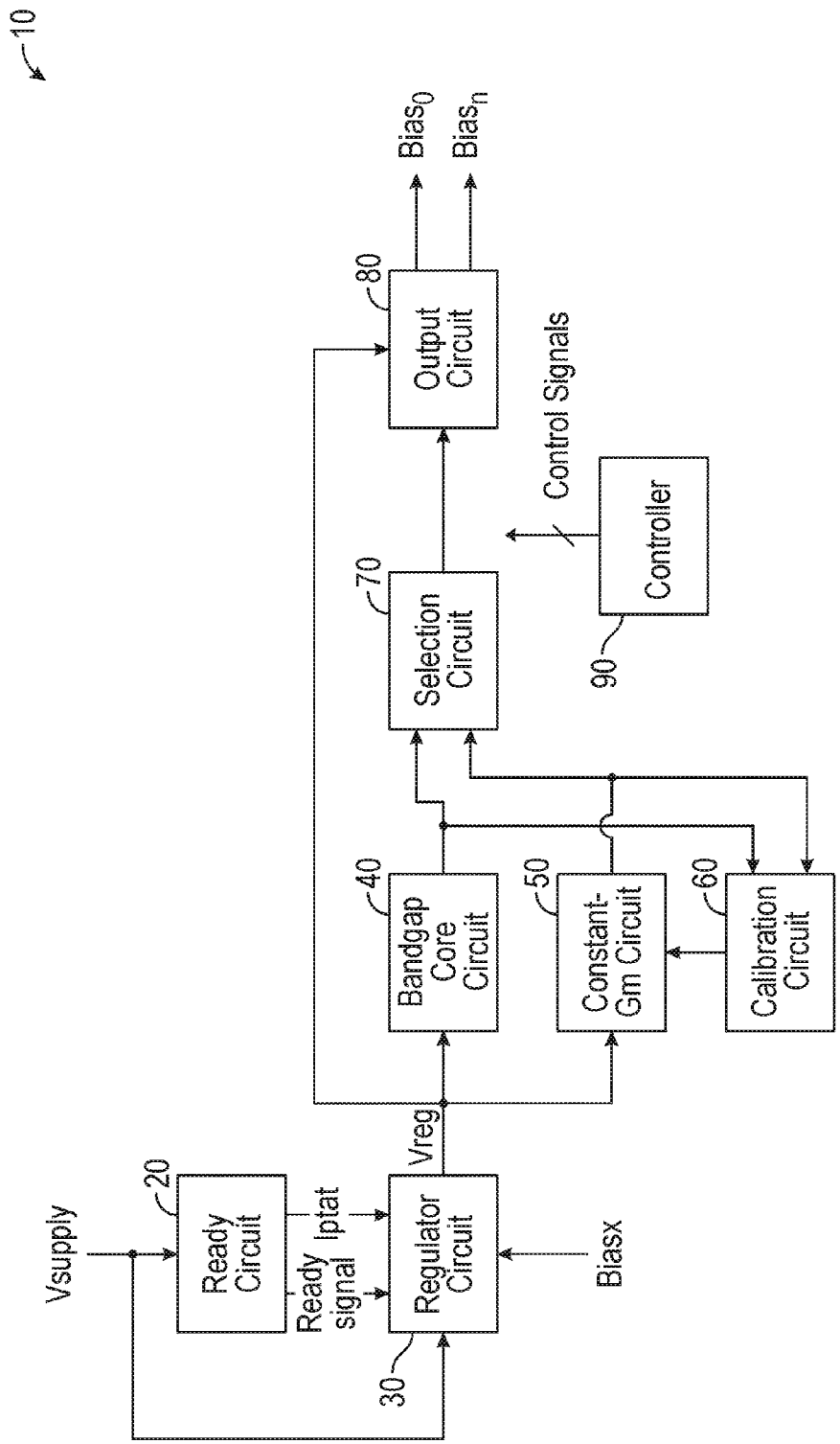
FIG. 1 is a high level block diagram of a bias circuit in accordance with an embodiment.

Referring to FIG. 1, shown is a high level block diagram of a bias circuit in accordance with an embodiment. As shown in the illustration of FIG. 1, bias circuit 10 may provide for a low power highly accurate generator of bias sources for use in a variety of client circuit blocks of a given IC such as a microcontroller unit (MCU) or other IC including an MCU or other controller circuitry. In various embodiments, bias circuit 10 may be used to provide accurate/low-noise bias outputs (e.g., currents) to client circuits. Such bias outputs may be used by these circuits to bias a variety of different circuit types such as comparators, amplifiers etc., and/or to generate accurate current/voltage references.

In general, bias circuit 10 is configured to receive a supply voltage Vsupply which, when received at a given level after power on, is sufficient to operate bias circuit 10 to enable generation of a plurality of bias outputs $Bias_0$-$Bias_n$. In different embodiments, the bias outputs may be generated as voltages or currents, depending on desired use and implementation.

In the embodiment shown, bias circuit 10 includes a ready circuit 20 configured to receive the supply voltage Vsupply and generate a ready signal, which is provided to a regulator circuit 30 when the supply voltage reaches a threshold level. In addition, ready circuit 20 may generate a reference value, implemented in one embodiment as a proportional to absolute temperature current (Iptat). This reference value may be used to generate a reference voltage within regulator circuit 30 while the circuit is in a startup mode, before a more reliable reference voltage can be generated from a received bias output from bias circuit 10.

In an embodiment, regulator circuit 30 may be implemented as an on-chip low dropout (LDO) regulator to provide a regulated voltage Vreg to various components of bias circuit 10. In the embodiment shown, regulator circuit 30 generates Vreg and provides it to a plurality of destinations, including a bandgap bias circuit 40, a constant-transconductance (Gm) circuit 50, and an output circuit 80.

In the embodiment shown, bandgap bias circuit 40 may be configured to generate an output bandgap bias current (Ibgr) which is provided to a selection circuit 70. Note that a bandgap current can be generated by applying a bandgap voltage (which is a temperature independent voltage) over a resistor Rx. In turn, the bandgap voltage can be recreated by sourcing the bandgap current into a resistor, which preferentially has identical temperature compensation to Rx. In one embodiment, selection circuit 70 may be implemented as a switch. As further shown, constant-Gm circuit 50 may also generate an output Gm bias current (Igmc). These currents are further coupled in feedback to a calibration circuit 60. As will be described herein, calibration circuit 60 may be configured to periodically compare the Gm bias current generated by constant-Gm circuit 50 with the bandgap bias current generated by bandgap bias circuit 40 to calibrate the Gm bias current against the more accurate bandgap bias current. This is the case, as in particular embodiments constant-Gm circuit 50 may be configured to operate at a lower power level than bandgap bias circuit 40. As such, during certain idle times of an IC or other device including bias circuit 10, bandgap bias circuit 40 may be placed in a low power or sleep mode and the bias current generated by constant-Gm circuit 50 may be selectively provided to an output circuit 80.

In various embodiments, output circuit 80 may be configured as one or more current mirrors to generate a plurality of bias outputs, $Bias_0$-$Bias_n$. In some cases, at least one of these outputs may be provided as a feedback input $Bias_x$ to regulator circuit 30 to be used to generate a reference voltage for use in regulating the output voltage of regulator circuit 30.

As further shown in FIG. 1, a controller 90 may be all or part of a control logic, or may be an independent logic within a MCU. Controller 90 is adapted to control the various components of bias circuit 10. For example, when underlying client circuits are inactive or otherwise have no need for a given one or more bias output, at least some portions of bias circuit 10 may be powered off. Furthermore, when the overall circuit is in a low power state, such as a metering or other sensing device that operates to periodically take measurements, some or all of the bias outputs may be controlled to remain active, using portions of the components of bias circuit 10. Thus controller 90 may provide control signals to one or more components of bias circuit 10 (not shown for ease of illustration in FIG. 1) to control power states of the components based on overall circuit state. Note in some cases, controller 90 may be configured to execute instructions stored in a non-transitory storage to control the bias circuit. In other cases, controller 90 may be implemented as a hard-wired state machine to result in lower current consumption, since a main CPU can be in sleep mode when refresh and calibration is performed, to provide a more robust solution. Understand while shown at this high level in the embodiment of FIG. 1, many variations and alternatives are possible.

Figure 2:
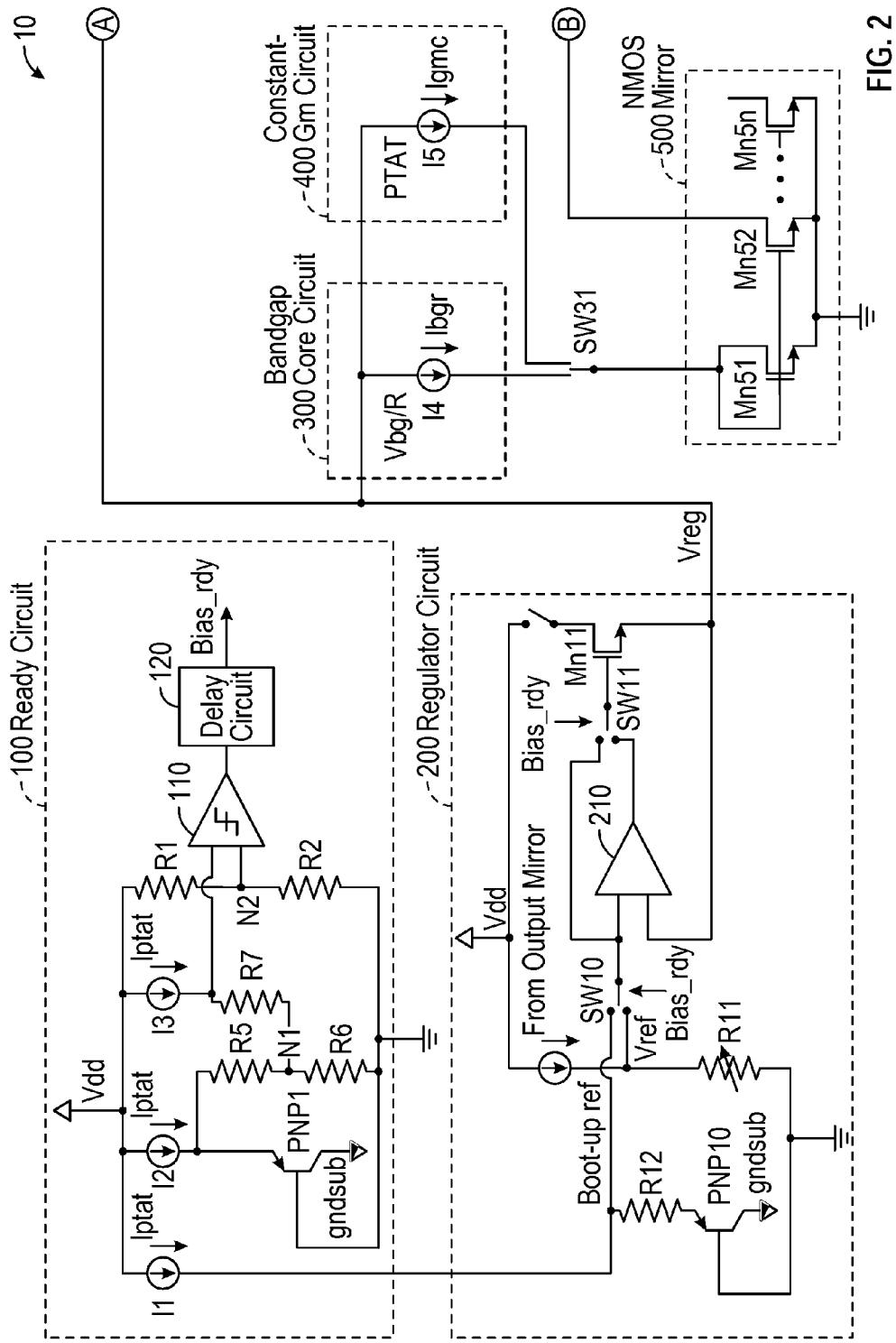
Figures 1, 2:
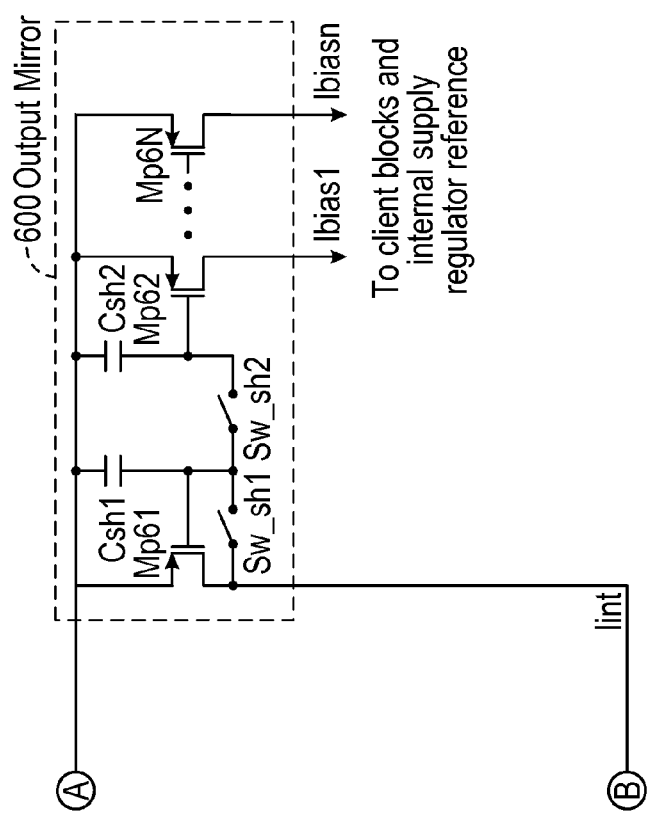

Referring now to FIGS. 2 and 2-1, shown is a block diagram including further details of a bias circuit in accordance with an embodiment. In FIG. 2, bias circuit 10 is shown with some schematic details of the individual circuit blocks. As seen, a ready circuit 100 couples to a regulator circuit 200 that in turn is configured to generate a regulated voltage Vreg. As seen, this regulated voltage is provided as a supply voltage to a bandgap core circuit 300 and a constant-Gm circuit 400, as well as to an output circuit 600. Note that the current output by constant-Gm circuit 400 varies strongly with temperature. As such, constant-Gm circuit 400 may be calibrated against bandgap core circuit 300 at regular intervals. In an embodiment, bandgap core circuit 300, constant-Gm circuit 400, and regulator circuit 200 may be configured to operate in a duty cycle (ON/OFF) mode in order to achieve very low current consumption, particularly when implemented in a battery operated IC. To this end, charge is held at one or more sample and hold (S/H) capacitors connected in parallel between gate and source terminals of output transistors of output circuit 600 in order to provide continuous bias currents to client blocks, including during OFF periods. Alternatively, no explicit S/H capacitor may be present, since the charge can be held at intrinsic gate-source capacitance of many PMOS devices in parallel.

As further illustrated, a selected one of the currents generated in bandgap core circuit 300 and constant-Gm circuit 400 may be provided via a switch SW31 to an intermediate output circuit 500 that in turn provides an intermediate current to output circuit 600 which in turn generates a plurality of bias currents $I_{bias1}$-$I_{biasN}$. By way of switch SW31, current is sourced to intermediate circuit 500 either from bandgap core circuit 300 (which may be configured for low noise/high accuracy) or from constant-Gm circuit 400 (which may be configured to have very low current consumption/fast start-up). These bias currents may be provided to various circuits with such as comparators, amplifiers and/or voltage and current reference generation circuits within client circuits of a device. In addition, at least one of the bias currents may be provided as a feedback bias current to regulator circuit 200, as described further herein.

As shown in further detail in FIG. 2, ready circuit 100 is configured to generate a ready signal, Bias_rdy, when a sufficient supply voltage level is attained so that correct operation of bias circuit 10 can be realized. More specifically, ready circuit 100 includes a plurality of current sources $I_1$-$I_3$, each configured to generate an independent PTAT current, Iptat. Note that current source $I_1$ provides a PTAT current as an initial reference value for use by regulator circuit 200. In turn, current source $I_2$ is coupled to a source terminal of a first bipolar transistor PNP1 having a gate terminal coupled to a reference voltage node (e.g., a ground level), and a drain terminal coupled to a substrate ground. The source terminal of transistor PNP1 is further coupled to a resistor R5 coupled in series with another resistor R6. In addition, a resistor R7 couples between an inter-resistor node N1 and third current source $I_3$.

As further seen in FIG. 2, current source $I_3$ and resistor R7 couple to a first input terminal of a comparator 110, which in an embodiment may be implemented as a Schmitt trigger or hysteretic comparator. In turn, a second input terminal of comparator 110 is coupled to an inter-resistor node N2 coupled between resistors R1 and R2. In operation, comparator 110 is configured to generate a positive output when supply voltage Vdd exceeds a reference value. When it does, comparator 110 generates a positive output indication, which is delayed by a delay circuit 120 to provide an additional measure of delay before issuance of the ready signal, Bias_rdy, indicating that the supply voltage is at a sufficient level to appropriately power bias circuit 10.

As such, ready circuit 100 is configured to indicate when the supply voltage is high enough for bias circuit 10 to safely operate within specified limits. Note that in some embodiments, ready circuit 100 may further sense the output of regulator circuit 200, such that the output of comparator 110 goes HIGH only when both external supply Vdd and internal supply Vreg are above predefined thresholds. In this case, an AND function can be implemented using an output of another comparator that detects when the regulated supply voltage exceeds an NMOS device threshold, as an example.

With the design shown in FIG. 2, ready circuit 100 provides a secondary circuit function of generating a boot-up reference for regulator circuit 200, which is used during an IC start-up sequence before a more accurate reference current is available.

In various embodiments, ready circuit 100 thus performs very accurate bias ready threshold detection. Also note that the lower boundary of a bias ready threshold determines the minimum supply voltage at which circuits like brown-out detectors are to be fully functional. In turn, a higher boundary of the bias ready threshold determines the minimum bootable supply voltage for the system. In an embodiment, a design may target to have the lowest possible spread between high and low boundaries for threshold over temperature and process variation. In addition, a given design may also set the threshold as close as possible to the minimum battery/supply voltage level and/or any brown-out detector threshold.

Note that reference trimming for comparator 110 is not available during IC boot-up because a trim code from non-volatile memory is not available during boot-up processes and the reference is designed to have low variation over supply, process and temperature. Nevertheless, embodiments provide very accurate threshold detection without using a bandgap-type circuit, which typically requires an array of bipolar transistors for accurate reference generation.

With reference to regulator circuit 200, a tightly controlled regulated voltage Vreg is output via a source follower-configured n-channel metal oxide semiconductor field effect transistor (MOSFET or NMOS) MN11. In an embodiment, this transistor may be a native (natural) MOSFET having a threshold voltage (Vt) around 0V to provide improved headroom. A native transistor (or sometimes natural transistor) is a variety of MOSFET that is intermediate between enhancement and depletion modes. To tightly control the output voltage, MOSFET MN11 is gated by an amplifier 210, details of which are described further below. As shown, amplifier 210 receives at a second input terminal the regulated voltage output in feedback and at a first input terminal a reference signal coupled to a reference voltage node Vref, which is selectively provided by way of switch SW10 to be either a voltage generated using the PTAT current from current source $I_1$ of ready circuit 100, or a more accurate reference voltage obtained from a bias current generated by output mirror circuit 600. As seen, the ready signal controls switches SW10 and SW11 to cause, respectively, an appropriate reference to be provided to amplifier 210 and an appropriate signal to be provided to the gate terminal of MOSFET MN11. As further illustrated in FIG. 2, a resistor R12 couples between a boot-up reference line and source terminal of a bipolar transistor PNP10 having a gate terminal coupled to a reference voltage node (e.g., a ground level) and a drain terminal coupled to a substrate ground. In addition, a resistor R11, which in an embodiment may be a controllable (e.g., trimmable) resistor, couples to the reference voltage node.

Still with reference to FIG. 2, in this high level view, bandgap core circuit 300 is illustrated as a current source $I_4$ to generate a bandgap current Ibgr. In turn, constant-Gm circuit 400 is also illustrated as a current source $I_5$ to generate a Gm current Igmc. In turn, a selected one of these currents is provided via switch SW31 to intermediate output circuit 500. In the embodiment shown, intermediate output circuit 500 is implemented as an NMOS current mirror with parallel MOS- FETs MN51 and MN52 having commonly coupled gate and source terminals and coupled in a current source configuration to provide an output current $I_{int}$ to output circuit 600. Where present, additional MOSFETs in the NMOS mirror couple to multiple instances of output mirror circuit 600. Multiple instance of output mirror circuit 600 may be beneficial, for example, to reduce interference between client bias currents when client blocks currents are turning ON and OFF. Other benefits of multiple instances include the ability to optimize output mirror for different bias current values, as some might deliver different magnitudes of bias currents. Some output mirror instances can have additional trim bits to further improve bias current accuracy.

Finally with reference to FIG. 2, output circuit 600 provides a CMOS-based current mirror including a plurality of p-channel MOSFETS (or PMOS) transistors MP61-MP6N. Note that output-connected transistors MP62-MP6N are each configured to provide a bias current $I_{bias1}$-$I_{biasN}$. These PMOS devices may have varied sizes to provide different current values, e.g., by parallel combination of multiple identical transistor units, to guarantee optimum current matching. Note that output mirror circuit 600 provides for a sample and hold configuration such that a charge can remain stored on sample/hold (S/H) capacitors Csh1-Csh2, controlled to be selectively coupled to the corresponding gate terminals of the PMOS transistors (when switches SW_sh1-SW_sh2 are open). And in turn, these capacitors are charged or refreshed when these switches are closed. In other cases, this S/H function may be implemented using a single switch and capacitor. Understand while shown at this high level in the embodiment of FIG. 2, many variations and alternatives are possible.

Figure 3:
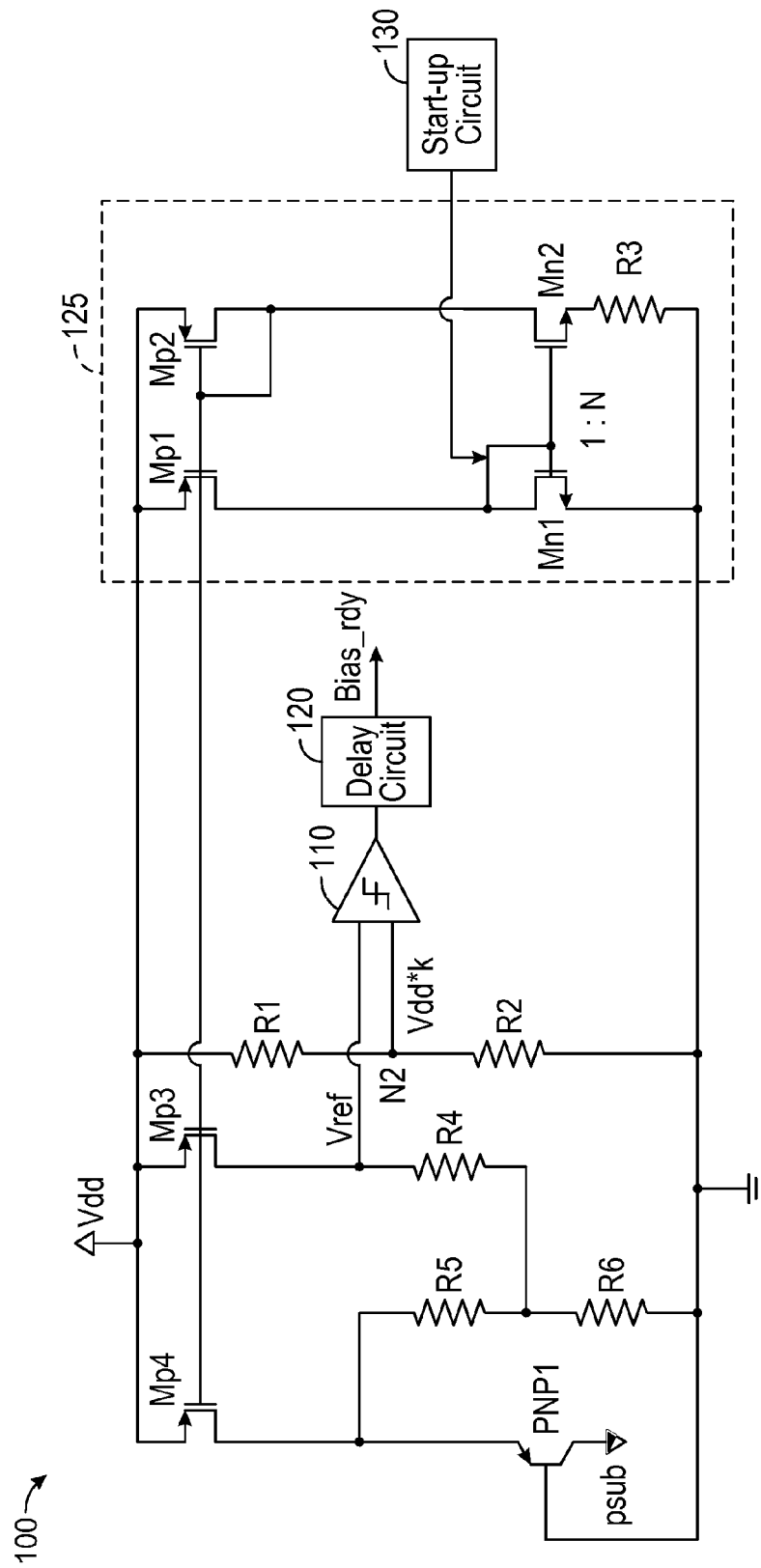
FIG. 3 is a schematic diagram including still further details of a ready circuit in accordance with an embodiment.

Referring now to FIG. 3, shown is a schematic diagram including still further details of a ready circuit in accordance with an embodiment. As seen in FIG. 3, ready circuit 100 is generally configured as described above with regard to ready circuit 100 of FIG. 2. However, details regarding current sources $I_2$ and $I_3$ are shown. Here, current source $I_2$ is implemented by way of MOSFET MP4, having a gate terminal commonly coupled with the output of current generation circuit 125 and drain terminal coupled to resistor R5 and the source terminal of bipolar transistor PNP1. Similarly, current source 13 is represented by MOSFET MP3 having a gate terminal commonly coupled to an output of current generation circuit 125 and having a drain terminal coupled to the reference voltage node.

Not shown for ease of illustration is another PMOS transistor that provides current source $I_1$ as a boot-up reference signal to regulator circuit 200. Thus as shown in the arrangement of FIG. 3, a current is sourced into a single bipolar transistor and resistor arrangement, which results in very low variation of comparator reference over process and temperature with a significantly reduced area and circuit complexity.

As shown in FIG. 3, the reference voltage Vref for comparator 110 is generated using a CMOS transistor-based PTAT current from current generation circuit 125. As seen, current generation circuit 125 includes CMOS-based current mirrors including diode-connected MOSFETs MN1 and MP2 and additional MOSFETs MP1 and MN2. MOSFETs MP1 and MP2 have commonly coupled gate terminals and source terminals, and drain terminals coupled to the drain terminals of MOSFETs MN1 and MN2, which also have commonly coupled gate terminals and source terminals. In an embodiment, MOSFETs MN1 and MN2 may be differently sized, with a ratio of 1:N. More particularly, MN2 is sized larger than MN1. In different embodiments, N may generally be greater than or equal to 4 (e.g., N=8 or 16 in some cases).

Further, a resistor R3 couples between a reference level (e.g., ground) and the source terminal of MOSFET MN2.

Because current generation circuit 125 is effected in a positive feedback configuration, to ensure proper operation upon startup, a startup circuit 130 couples to the commonly coupled gate and drain terminals of MOSFET MN1. With these two current mirrors in positive feedback, there are two states or levels, either with zero current or pulling the gate terminals of MOSFETs MN1 and MN2 to a higher level by injecting a current via startup circuit 130. When an appropriate current has been established, startup circuit 130 may thereafter be disabled.

Figure 4:
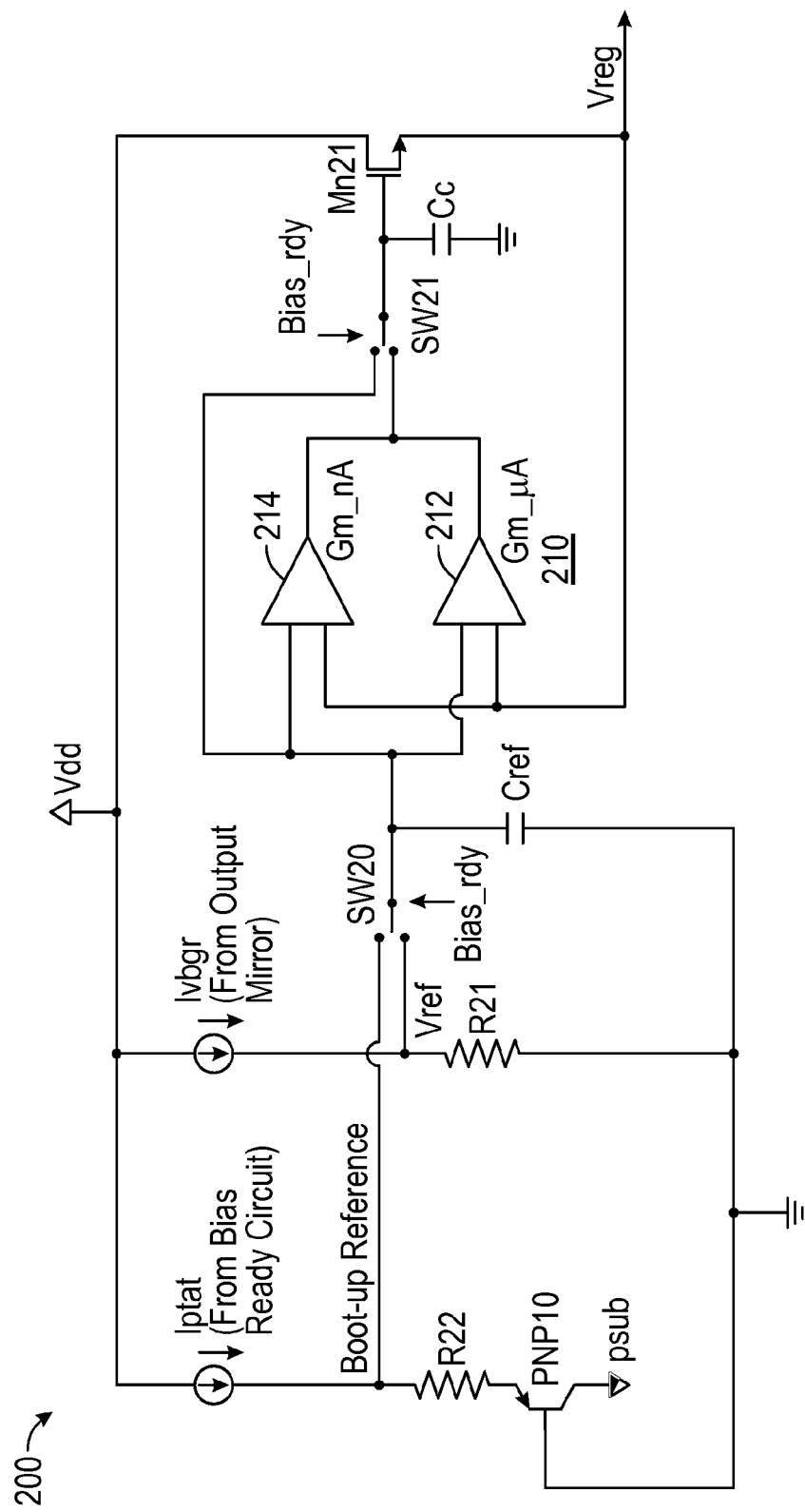
FIG. 4 is a schematic diagram of further details of a voltage regulator circuit in accordance with an embodiment.

Referring now to FIG. 4, shown is a schematic diagram of further details of a voltage regulator circuit in accordance with an embodiment. More specifically, FIG. 4 shows further details of regulator circuit 200. As seen, amplifier 210 is represented by separate pre-amplifiers 212 and 214. In an embodiment, pre-amplifiers 212 and 214 may be implemented as one or more transconductors that are configured to output a current to an output device, implemented as a source follower-configured MOSFET MN21.

Pre-amplifier 212 ("Gm_µA") is configured as a secondary pre-amplifier, and may be designed to consume current on the order of several micro-amperes (µAs). Pre-amplifier 212 is designed to have high PSRR and a fast start-up for duty cycle mode. In embodiments, pre-amplifier 212 is configured to be ON only for short time periods, to replenish/refresh charge in all S/H capacitors in order to keep all output bias currents accurate.

Pre-amplifier 214 ("Gm_nA") is configured as a primary pre-amplifier, and may be designed to consume current on the order of several nano-amperes (nA's). Pre-amplifier 214 is designed for a main function to keep the supply voltage for the output mirrors alive, so that bias currents to client blocks can be un-interrupted. In embodiments, pre-amplifier 214 is configured to be always ON, to provide good PSRR and load regulation, when constant-Gm circuit and/or BGR core circuit turns ON.

The reference input coupled to first input terminals of pre-amplifiers 212 and 214 is selectively provided under control of switch SW20 (itself controlled by the Bias_rdy signal) to be either the boot-up reference signal generated from the PTAT current (Iptat) received from the ready circuit or the more accurate reference voltage level received from a bias output (Ivbgr) of the output circuit. Note further that a reference capacitor Cref couples to these input terminals. The second input terminals of pre-amplifiers 212 and 214 are coupled to receive the regulated voltage output from regulator circuit 200.

As further illustrated, the Bias_rdy signal also controls switch SW21 to selectively provide the output of pre-amplifiers 212 and 214 or the boot-up reference signal to the gate terminal of MOSFET MN21, which acts as an output device. As further illustrated a coupling capacitor Cc also couples to this terminal. The boot-up reference obtained from the PTAT current received from the ready circuit is less accurate, and its main function is to guarantee successful bias circuit start-up (boot-up) before bias currents for the pre-amplifiers and for accurate reference voltage generation are available. As shown in FIG. 4, when selected by switches SW20 and SW21 controlled by Bias_rdy, the boot-up reference connects directly to the gate terminal of source follower transistor MN21, thus bypassing both pre-amplifiers 212 and 214 during boot-up. Note that this boot-up reference is biased by the CMOS-based PTAT current received from ready circuit 100 in order to achieve low reference drift over temperature.

After bandgap/bias circuits boot up successfully, which is indicated by Bias_rdy, switches SW21 and SW22 flip selection from this boot-up reference to a more accurate reference Vref and also switch the input to the gate terminal of output device MN21 to be coupled to the output of pre-amplifiers 212 and 214. Note that this Vref reference is more accurate and is also has excellent power supply rejection ratio (PSRR) since the reference current is derived from circuitry powered by the regulated supply voltage Vreg.

More specifically, while the main function of regulator circuit 200 is to provide high PSRR and excellent load regulation when bandgap core circuit 300 and/or constant-Gm circuit 400 are enabled (ON mode), regulator circuit 200 also provides supply voltage for output mirrors when bandgap core circuit 300 or constant-Gm circuit 400 are disabled (OFF mode), because output current mirrors still are to deliver current to at least some circuit blocks of the device during OFF mode. Understand that in this OFF mode, output mirrors are in a HOLD mode and the gate charge is held at sample capacitors, as described herein. Note that Vref is also duty cycled to reduce current consumption. When Vref is duty cycled (sample and held) the current Ibgr can be turned ON and OFF and the charge is held at capacitor Cref during the OFF period. In turn, a corresponding S/H switch connects Cref to Vref to replenish the charge during ON mode. The S/H switch can be, for example, coupled between switch SW20 and capacitor Cref (in series with SW20). The regulated supply voltage Vreg may always be present while an IC including bias circuit 10 is on and at least portions of regulator circuit 200 may be duty cycled to reduce current consumption. Note that this reference voltage generated from a bias output from output mirror circuit 600 may complicate a start-up sequence, but can greatly improve PSRR and reference voltage accuracy. Understand while shown at this high level in the embodiment of FIG. 4, many variations and alternatives are possible.

Figure 5:
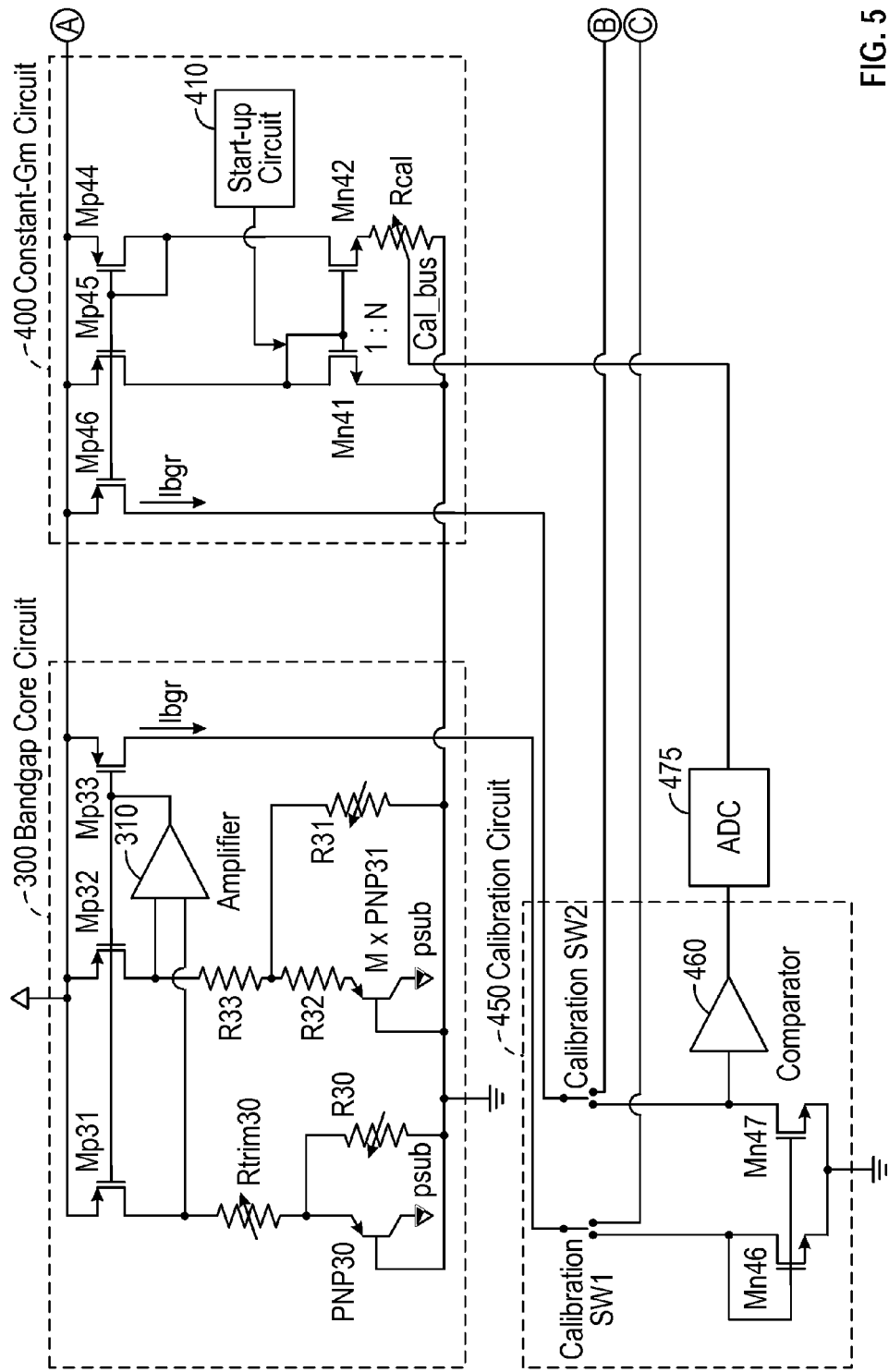
Figures 1, 5:
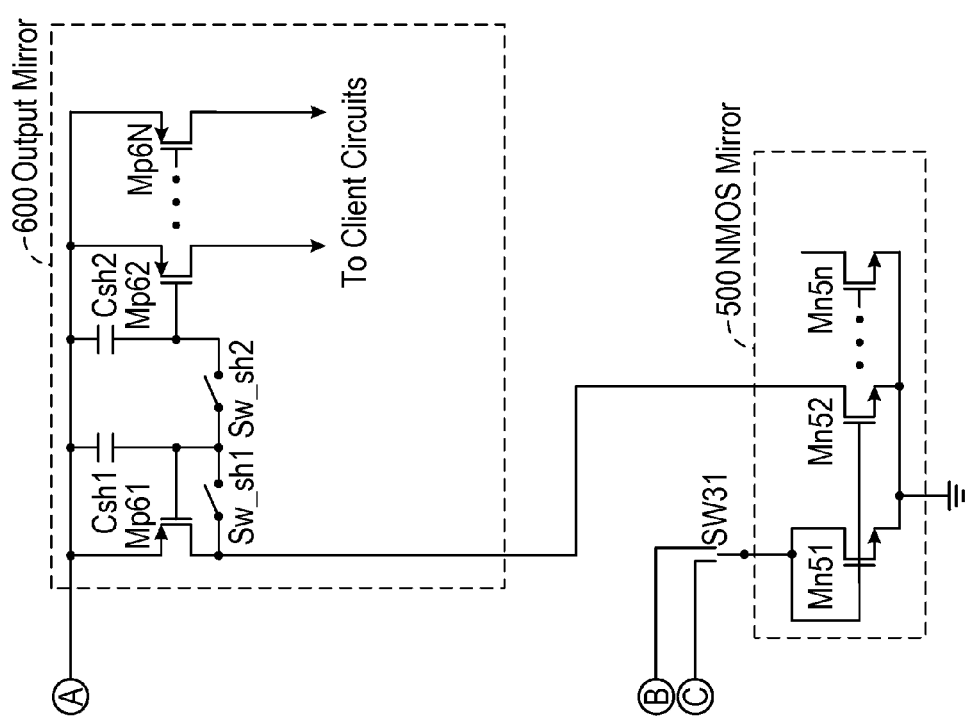

Referring now to FIGS. 5 and 5-1, shown is a schematic diagram of further details of additional circuits within a bias circuit in accordance with an embodiment. As shown in FIG. 5, bandgap core circuit 300 is illustrated to include a plurality of MOSFETs MP31-MP33, all having commonly source terminals coupled to a supply voltage (which corresponds to the regulated voltage output by regulator circuit 200) and commonly coupled gate terminals (driven by the output of an amplifier 310). As seen, the drain terminal of MOSFET MP31 couples to a second input terminal of amplifier 310 and, via a trim resistor (R30) which in an embodiment is a controllable trim resistor, to a bipolar transistor PNP30, which is coupled in parallel with another resistor R33. In turn, the second input terminal of amplifier 310 is coupled to the drain terminal of MOSFET MP32, further coupled to a resistor R33 in turn coupled in series to resistor R32 and in parallel with resistor R31 (which in an embodiment may be a temperature trimmable resistor). Resistor R32 also couples to a source terminal of bipolar transistor PNP31, which may be of a different size than bipolar transistor PNP30 (having relative ratio of 1:M). The drain terminal of MOSFET MP33 provides the bandgap bias current Ibgr, which as seen is selectively coupled to a calibration circuit 450 or a switch SW31 for output when selectively controlled.

Constant-Gm circuit 400 includes CMOS-based current mirrors having MOSFETs MN41, MN42, MP44 and MP45. As shown, these current mirrors are coupled to an output MOSFET MP46 to provide from its drain terminal the constant-Gm bias current Igmc which similarly couples to calibration circuit 450 and switch SW31. As further illustrated in FIG. 5, constant-Gm circuit 400 further includes a startup circuit 410 which may operate to inject a current upon startup to properly control the current mirror by way of delivery of current to the commonly coupled gate and drain terminals of MOSFET MN41 (to operate as similarly described above with regard to startup circuit 130 of FIG. 3).

During duty cycle mode, embodiments may (during an ON cycle) use constant-Gm circuit 400 instead of bandgap core circuit 300 (especially when low noise bias currents are not required), because constant-Gm circuit 400 may be configured to consume less current while having a faster start-up time. However, one drawback of using constant-Gm circuit 400 is that its output current is highly temperature dependent (PTAT-type), and thus this circuit may be calibrated against bandgap core circuit 300, e.g., according to a periodic interval (which can vary in different embodiments).

With reference now to calibration circuit 450, when controlled to perform a comparison (responsive to selective control of switches CAL SW1-CAL SW2), the bias currents output by circuits 300 and 400 couple to a current mirror formed of MOSFETs M46 and M47. This current mirror outputs a comparison value to a comparator 460, which outputs a positive value when the bias current from constant-Gm circuit 400 exceeds the bias current by bandgap core circuit 300. In one implementation, the output of comparator 460 is inverted, meaning that the comparator outputs a positive value when the bias current from constant-Gm circuit 400 is lower than the bias current from bandgap core circuit 300. As seen, the output of comparator 460 is provided to a digitizer 475 configured to perform a successive approximation algorithm. In other cases, signal inversion can be accomplished inside digitizer 475. In an embodiment, this digitizer may be implemented as a successive approximation register to generate a calibration value, which may be an N-bit calibration value that is used to control a calibration resistor Rcal of constant-Gm circuit 400.

Since the bias current of constant-Gm circuit 400 is directly proportional to die temperature (PTAT current) and the bias current of bandgap core circuit 300 is nearly constant over temperature, the N-bit calibration value is also directly proportional to absolute temperature. The N-bit calibration number can be converted to degrees of Celsius, for example, using the following formula: Temp=(N_bit_cal−OFFSET)/GAIN+27, where OFFSET and GAIN are linear fit constants. This calibration value may be further sent to logic of an MCU to provide a temperature indication, which the logic may use in updating various device characteristics or parameters. Note that the calibration of constant-Gm circuit 400 is not infinitely accurate due to various random mismatches, systematic errors and error due to finitely small calibration step, which results in a difference (error) between the bias currents from bandgap core circuit 300 (Ivbgr) and constant-Gm circuit 400 (Igmc). In embodiments, this error may be kept very small, so that client blocks see nearly identical bias currents regardless of the source.

In an embodiment, the following procedure may be used to reduce constant-Gm calibration error due to various error sources as mentioned above. First, calibration may be performed using digitizer 475 to calibrate constant-Gm current. Then an error between the constant-Gm current Igmc and bandgap core current Ibgr is measured. Err_cal=Igmc−Ibgr (Err_cal ideally may be zero). From this calibration error (Err_cal) an updated trim setting that reduces calibration error to a minimum may be calculated. This process may be done during production test, and the calculation performed by test equipment software.

Using this updated value, the calibration may be performed again to verify that error has been reduced to a desired level (e.g., below an error threshold). If so, the trim setting may be stored, e.g., in a non-volatile memory, and used during future calibration operation of constant-Gm circuit 400. In this way, calibration accuracy is increased without significantly increasing circuit complexity, calibration bits or silicon area. Note that the output of the calibration itself (Cal_bus) can be stored in a volatile memory (e.g., register), since it is valid only for a given die temperature.

In normal (non-calibration) mode, instead calibration switches CAL SW1-CAL SW2 provide the bias currents output from circuits 300 and 400 to switch SW31, which selects a given one of the bias currents to provide to intermediate output circuit 500.

Figure 6:
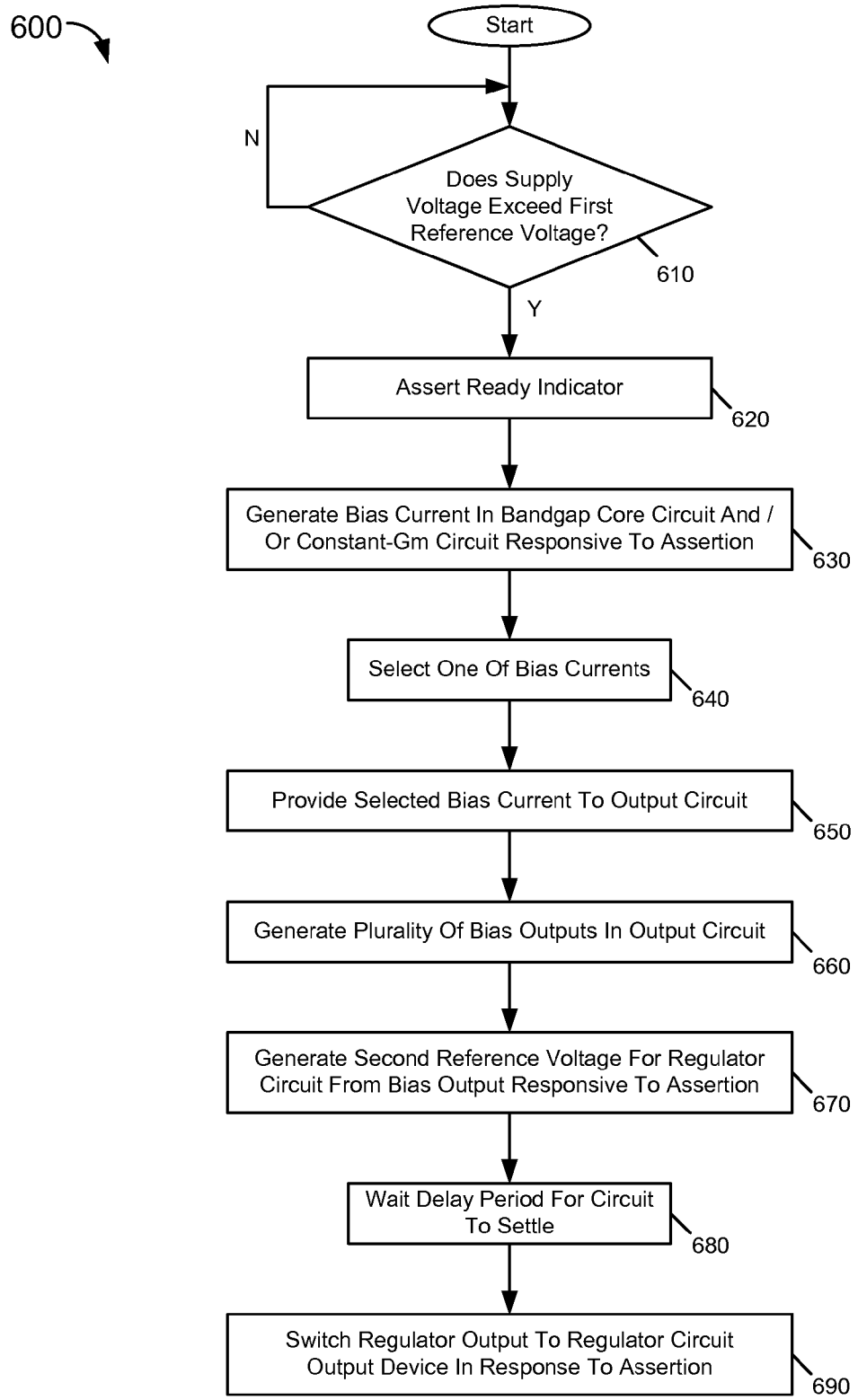
FIG. 6 is a flow diagram of a method of operation of a bias circuit, such as the circuit shown in FIGS. 1 and 2.

Referring now to FIG. 6, shown is a flow diagram of a method of operation of a bias circuit, such as the circuit shown in FIGS. 1 and 2. As illustrated, method 600 begins by determining whether a supply voltage exceeds a first reference voltage (diamond 610). This comparison may be made in a comparator of a ready circuit that compares an incoming supply voltage with a reference value. When it is determined that the supply voltage exceeds this reference voltage (indicating availability of a supply voltage suitable for proper circuit operation), control passes to block 620 where a ready indicator may be asserted. Specifically, this ready indicator may be sent from a ready circuit to a voltage regulator.

Still referring to FIG. 6, at block 630 a bias current may be generated in a bandgap core circuit and/or a constant-Gm circuit. One of these bias currents may be selected (block 640) and provided to an output circuit 650, which in turn generates a plurality of bias outputs from this bias current (block 660).

At block 670, a second reference voltage may be generated for the regulator circuit from one of the bias outputs. After waiting a delay to allow the circuit to settle (block 680), at block 690 the regulator output may be switched to an output device (e.g., a source follower-configured transistor) to enable the regulated voltage to be provided to various downstream portions of the bias circuit, including a bandgap bias circuit, a constant-Gm circuit, and an output circuit. Understand while shown at this high level in FIG. 6, operation of a bias circuit may include other constituents steps.

Figure 7:
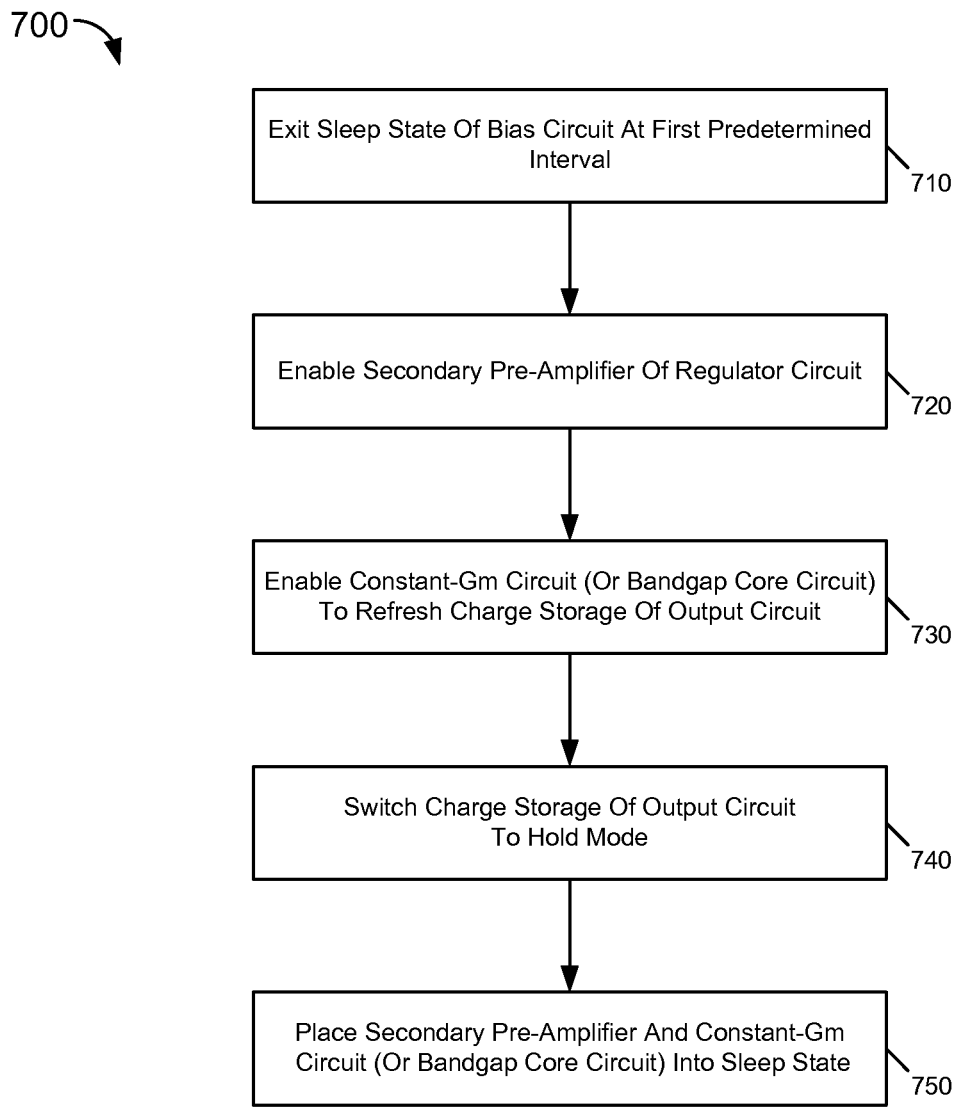
FIG. 7 is a flow diagram of a method for controlling a bias circuit in a duty cycle mode according to an embodiment.

Referring now to FIG. 7, shown is a flow diagram of a method for controlling a bias circuit in a duty cycle mode according to an embodiment. As shown in FIG. 7, method 700 may be used to wake various components of the bias circuit to perform charge refreshing operations so that appropriate bias outputs can continue to be generated while much of the bias circuit is in a sleep mode. In some embodiments, a controller coupled to the bias circuit (such as an MCU or other control logic) may perform method 700 to cause various portions of the circuit to be enabled to perform operations and thereafter return to the sleep state.

As illustrated, method 700 begins by exiting a sleep state of the bias circuit at a first predetermined interval (block 710). In an embodiment, this predetermined interval may be on the order of approximately one millisecond. As part of this exit, a secondary pre-amplifier of a regulator circuit may be enabled (block 720). As an example, this secondary pre-amplifier may be a Gm-μA amplifier. At block 730 a constant-Gm circuit (or a bandgap core circuit) may be enabled to refresh a charge storage device of an output circuit (e.g., one or more capacitors). To this end, switching of the bias current generated by such circuit is enabled to allow these capacitors to be charged. Upon completion of this refresh charge, at block 740 the charge storage device may be switched to a hold mode. Thereafter, various powered up components of the bias circuit that were powered up for purposes of this refresh charge may be placed back into a sleep state (block 750). And accordingly, this duty cycle ON state may end and the bias circuit returns to operation in an OFF state or sleep state of the duty cycle mode.

Figure 8:
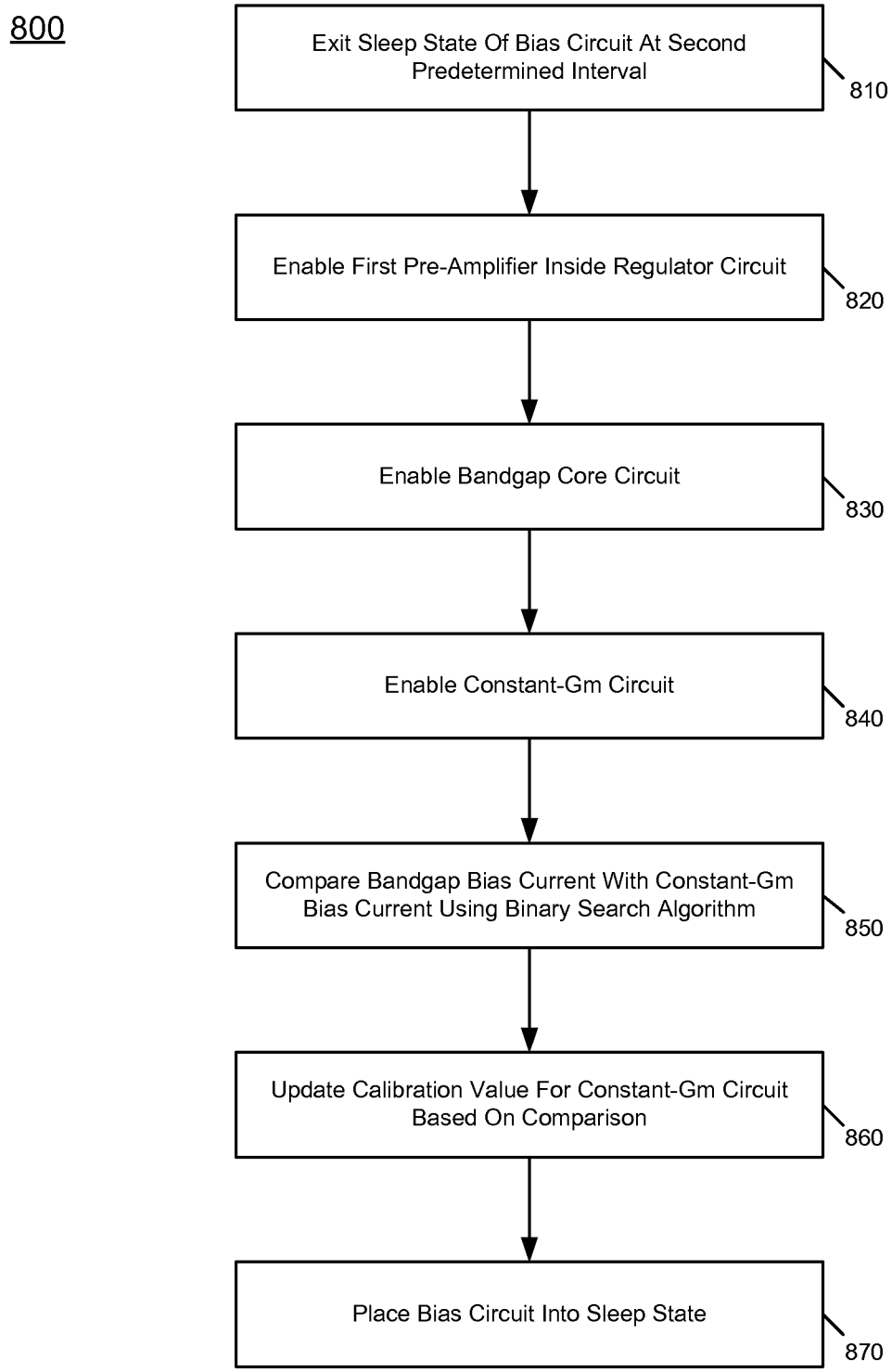
FIG. 8 is a flow diagram of a method for controlling a bias circuit in a duty cycle mode according to another embodiment.

Referring now to FIG. 8, shown is a flow diagram of a method for controlling a bias circuit in a duty cycle mode according to another embodiment. As shown in FIG. 8, method 800 may be used to wake various components of the bias circuit to perform a calibration operation so that the lower power constant-Gm circuit can be used in the duty cycle mode instead of the higher power consuming bandgap core circuit. In some embodiments, a controller coupled to the bias circuit (such as an MCU or other control logic) may perform method 800 to cause various portions of the circuit to be enabled to perform operations and thereafter return to the sleep state.

As illustrated, FIG. 8 begins by exiting a sleep state of the bias circuit at a second predetermined interval (block 810). The second predetermined interval may be longer than the first predetermined interval, and as an example may be between approximately 0.25 second-one second. Note that during an ON state of the duty cycle mode at this second predetermined interval, calibration operations may be performed to calibrate the constant-Gm circuit to the bandgap bias circuit. In this calibration mode of the ON state, a first pre-amplifier (e.g., the Gm-nA) of the regulator circuit may be enabled (block 820). In addition, both the bandgap core circuit and the constant-Gm circuit may be enabled (blocks 830 and 840).

Next at block 850 the bandgap bias current generated by the bandgap core circuit is compared with the constant-Gm bias current generated by the constant-Gm circuit. In an embodiment, this comparison may be performed using a binary search algorithm, e.g., using a successive approximation register. In a different embodiment, the binary search algorithm is used only during the first calibration after IC power-up. All successive calibrations can be accomplished by simple incrementing/decrementing of the existing N-bit calibration value until Igmc=Ibgr, which may result in faster calibration (lower current consumption), provided that the die temperature is not changing significantly (e.g., more than a few degrees) between calibrations, which is a reasonable assumption.

Next at block 860 a calibration value, which is used to calibrate the constant-Gm bias current to the bandgap bias current, may be updated based on the comparison. In addition, this calibration value, which is used to control a calibration resistance of the constant-Gm circuit, may be stored, e.g., in a nonvolatile storage for future use. Thereafter at block 870 the bias circuit may be placed into the sleep state. Understand while shown at this high level in the embodiment of FIG. 8, many variations and alternatives are possible.

Furthermore, understand that the above FIGS. 7 and 8 represent operation in a duty cycle mode in which portions of the circuitry of the bias circuit may be in an OFF state, even during the ON portions of the duty cycle mode. In other modes of operation such as an active mode in which an MCU or other main processing circuitry of the IC is in an active operation mode, all components of the bias circuit (with the exception of the ready circuit (and start up circuits) may be powered on.

Figure 9:
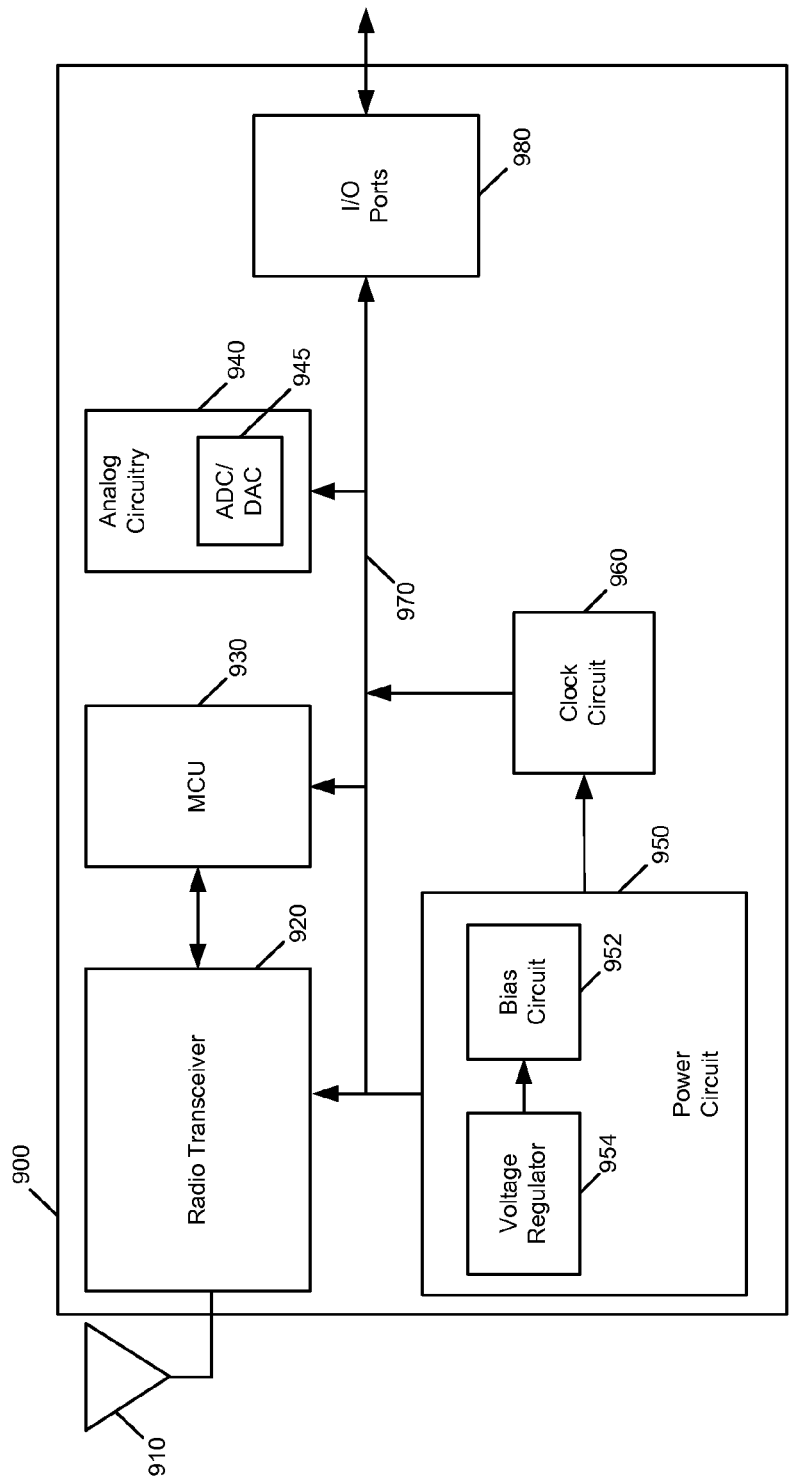
FIG. 9 is a block diagram of an integrated circuit in accordance with an embodiment.

Referring now to FIG. 9, shown is a block diagram of an integrated circuit in accordance with an embodiment. As shown in FIG. 9, integrated circuit 900 may take the form of a microcontroller or other such circuit. As seen, integrated circuit 900 is coupled to an antenna 910, which may provide for transmission and receipt of radio frequency (RF) signals of one or more bands (or in some cases multiple such antennas may be present).

In turn, antenna 910 couples to a radio transceiver 920 which may include one or more signal processing paths to process incoming and outgoing RF signals of the one or more bands. In turn, radio transceiver 920 communicates with an MCU 930, which may include the main processing and control circuitry of the integrated circuit. MCU 930 communicates with additional circuitry, including analog circuitry 940, which may act as an interface to various analog components such as a variety of different off-chip sensors that may couple to integrated circuit 900 via a set of I/O ports 980. In the embodiment shown, analog circuitry 940 includes an analog-to-digital/digital-to-analog circuitry (ADC/DAC) 945 to digitize incoming analog signals received from such off-chip sources and to convert to analog form digital information, such as control information to be communicated to off-chip sources. A set of interconnects 970 may couple the various components of the integrated circuit, to provide communication of power, clock and data signals.

Still with reference to FIG. 9, a power circuit 950 includes one or more voltage regulators 954 to provide regulated voltages to various components of integrated circuit 900. A bias circuit 952 as described herein may be used to indicate when an appropriate supply voltage is available for voltage regulator 954. In addition, bias circuit 952 may be configured to provide appropriate bias outputs to various client circuits with integrated circuit 900, including components within power circuits 950 and a clock circuit 960, which may be used to generate various clock signals using one or more internal oscillators that receive such bias signals. Still further note that additional bias outputs from bias circuit 952 may be provided to components within analog circuitry 940. Bias outputs may be provided to other components in some cases. Understand while shown at this high level in the illustration of FIG. 9, many variations and alternatives are possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a ready circuit to output a ready indicator when a supply voltage provided to the ready circuit and a voltage regulator is sufficient to operate the voltage regulator;
   the voltage regulator to receive the supply voltage and to output a regulated voltage, the voltage regulator to receive a first current from the ready circuit and to control the regulated voltage based on the first current when the ready indicator is inactive;
   a bias circuit to receive the regulated voltage and including a first circuit to generate a first bandgap bias current and a second circuit to generate a second bias current; and
   an output circuit to receive a selected one of the first bandgap bias current and the second bias current and output one or more bias outputs to one or more client circuits based on the selected one of the first bandgap bias current and the second bias current.

2. The apparatus of claim 1, wherein the voltage regulator is to control the regulated voltage based on one of the one or more bias outputs from the output circuit when the ready indicator is active.

3. The apparatus of claim 1, wherein the ready circuit comprises a first plurality of complementary metal oxide semiconductor (CMOS) current mirrors, wherein one of the first plurality of CMOS current mirrors is to provide the first current to the voltage regulator.

4. The apparatus of claim 1, wherein the output circuit comprises a second plurality of CMOS current mirrors to receive the selected one of the first bandgap bias current and the second bias current and to generate the one or more bias outputs therefrom.

5. The apparatus of claim 4, wherein the first circuit comprises a bandgap core circuit and the second circuit comprises a constant-transconductance circuit.

6. The apparatus of claim 5, wherein the voltage regulator comprises a first pre-amplifier to operate at a first power consumption level and a second pre-amplifier to operate at a second power consumption level, wherein the first pre-amplifier is controlled to be powered on during on portions of a duty cycle mode, and the second pre-amplifier is controlled to be powered on during the on portions and off portions of the duty cycle mode, the second power consumption level less than the first power consumption level.

7. The apparatus of claim 6, wherein the voltage regulator comprises:
   a first switch to provide a first reference voltage to the first pre-amplifier when the ready indicator is inactive and to provide a second reference voltage to the first pre-amplifier when the ready indicator is active; and
   a second switch to provide an output of the first pre-amplifier to an output device of the voltage regulator when the ready indicator is active and to provide the first reference voltage to the output device when the ready indicator is inactive.

8. The apparatus of claim 7, further comprising a controller to enable the constant-transconductance circuit to recharge a charge storage device of the output circuit at a first interval, and to enable the constant-transconductance circuit and the bandgap core circuit to perform a calibration of the second bias current to the first bandgap bias current at a second interval, the second interval greater than the first interval.

9. A method comprising:
   after a first predetermined interval, exiting a sleep state of a bias circuit and causing a charge storage device of an output circuit of the bias circuit to be refreshed using a first bias current generated by a constant-transconductance circuit of the bias circuit;
   after refreshing the charge storage device, causing the bias circuit to enter the sleep state;
   after a second predetermined interval, exiting the sleep state of the bias circuit and causing the first bias current to be compared to a second bias current generated by a bandgap bias circuit of the bias circuit, and updating a calibration value based on the comparison, wherein the calibration value is used to calibrate the first bias current to the second bias current; and
   after updating the calibration value, causing the bias circuit to enter the sleep state.

10. The method of claim 9, wherein exiting the sleep state after the first predetermined interval further comprises enabling a secondary pre-amplifier of a regulator circuit of the bias circuit.

11. The method of claim 10, wherein exiting the sleep state after the first predetermined interval further comprises enabling the constant-transconductance circuit while maintaining the bandgap bias circuit disabled.

12. The method of claim 11, further comprising enabling a primary pre-amplifier of the regulator circuit to cause the regulator circuit to output the regulated voltage.

13. The method of claim 9, further comprising, in an active mode of an integrated circuit including the bias circuit, exiting the sleep state and enabling the constant-transconductance circuit, the bandgap bias circuit, and a first pre-amplifier of the regulator circuit.

14. The method of claim 9, wherein updating the calibration value comprises storing, in a storage, a control setting for a resistance element coupled to a current mirror of the constant-transconductance circuit to control a resistance of the resistance element.

15. The method of claim 9, further comprising determining a temperature based on the calibration value and updating one or more device characteristics of the integrated circuit including the bias circuit based thereon.

16. The method of claim 9, further comprising using a state machine to control the bias circuit.

17. An integrated circuit comprising:
a plurality of client circuits, at least some of the plurality of client circuits to receive a bias signal; and
a bias circuit to generate a plurality of bias signals and provide at least some of the plurality of bias signals to one or more of the plurality of client circuits, the bias circuit comprising:
a ready circuit to indicate when a supply voltage is sufficient to operate the bias circuit;
a voltage regulator coupled to the ready circuit to output a regulated voltage;
a first bias circuit to generate a first bias current;
a second bias circuit to generate a second bias current; and
an output circuit to receive at least one of the first bias current and the second bias current and generate the plurality of bias signals therefrom, wherein the first bias circuit, the second bias circuit and the output circuit are to operate using the regulated voltage.

18. The integrated circuit of claim 17, wherein the voltage regulator, the first bias circuit and the second bias circuit are to operate in a duty cycle mode.

19. The integrated circuit of claim 17, wherein the ready circuit comprises:
a comparator having:
a first input terminal to receive a first voltage based on a proportional to absolute temperature (PTAT) current, the PTAT current generated via a complementary metal oxide semiconductor (CMOS) current generator circuit having a plurality of CMOS current mirrors;
a second input terminal to receive a reference voltage corresponding to a predetermined portion of the supply voltage; and
a comparison circuit to compare a first voltage based on the PTAT current to the reference voltage and to output a comparison value; and
a delay circuit to receive the comparison value and output a ready signal to the voltage regulator following a threshold period after the first voltage exceeds the reference voltage.

20. The integrated circuit of claim 17, further comprising a calibration circuit to compare the first bias current to the second bias current and to generate a calibration value therefrom, the calibration value to control a controllable resistance coupled to a current mirror of the second bias circuit.

21. The integrated circuit of claim 17, wherein the voltage regulator comprises:
a first pre-amplifier to operate at a first power consumption level; and
a second pre-amplifier to operate at a second power consumption level, the second power consumption level less than the first power consumption level.

22. The integrated circuit of claim 21, wherein the voltage regulator comprises:
a first switch to provide a first reference voltage to the first pre-amplifier when the ready indicator is inactive and to provide a second reference voltage to the first pre-amplifier when the supply voltage is sufficient to operate the bias circuit; and
a second switch to provide an output of the first pre-amplifier to an output device of the voltage regulator when the supply voltage is sufficient to operate the bias circuit and to provide the first reference voltage to the output device when the supply voltage is insufficient to operate the bias circuit.

23. The integrated circuit of claim 22, further comprising a controller to enable the second bias circuit to recharge a charge storage device of the output circuit at a first interval, and to enable the second bias circuit and the first bias circuit to enable the calibration circuit to compare the first bias current to the second bias current at a second interval, the second interval greater than the first interval.

\* \* \* \* \*